United States Patent

Yun

[11] Patent Number: 6,114,860
[45] Date of Patent: Sep. 5, 2000

[54] ROTARY COUPLED TRANSMISSION LINE CELL

[75] Inventor: Jae Hoon Yun, Daejeon, Rep. of Korea

[73] Assignee: Electronics and Telecommunications Research Institute, Daejeon, Rep. of Korea

[21] Appl. No.: 09/120,084

[22] Filed: Jul. 21, 1998

[30] Foreign Application Priority Data

Nov. 20, 1997 [KR] Rep. of Korea ................. 97-61580

[51] Int. Cl.$^7$ .................. G01R 27/04; H01P 1/06; H01P 1/00
[52] U.S. Cl. .................. 324/637; 333/261; 333/263
[58] Field of Search .................. 324/637, 636; 333/245, 261, 21 R, 263

[56] References Cited

U.S. PATENT DOCUMENTS

| | | | |
|---|---|---|---|
| 4,020,431 | 4/1977 | Saunders | 333/98 |
| 4,605,916 | 8/1986 | Tehori | 333/245 |
| 5,256,988 | 10/1993 | Izadian | 330/295 |
| 5,434,548 | 7/1995 | Thomson et al. | 333/261 |
| 5,793,215 | 8/1998 | Yun | 324/627 |
| 5,910,729 | 7/1999 | Yun | 324/627 |

OTHER PUBLICATIONS

"A Triple–TEM Cell: Three Polarizations in One Setup", Frank B.J. Leferink, pp. 573–578, date unknown.
"A Broadband Alternative EMC Test Chamber Based on a TEM Cell–Anechoic–Chamber Hybrid Concept", D. Hansen, P. Wilson, D. Koenigstein and H. Schaer, pp. 133–136, date unknown.
"1989 International Symposium on Electromagnetic Compatibility", L. Carbonini, 1991 IEEE pp. 8–13, International Symposium on EMC, Reprinted, with permission, from *Proceedings of the 1989 International Symposium on Electromagnetic Compatibility*; Nagoya, Japan, Sep. 8–10, 1989; pp. 133–137.
"Generation of Standard EM Fields Using TEM Transmission Cells", Myron L. Crawford, IEEE Transactions Electromagnetic Compatibilty, vol. EMC–16, No. 4, Nov. 1974 pp. 189–195.
"A Broadband Electromagnetic Environment Simulator (EMES)", Neith Pollard, Sandia Laboratories, Albuquerque, New Mexico, date unknown.

*Primary Examiner*—Safet Metjahic
*Assistant Examiner*—James C Kerveros
*Attorney, Agent, or Firm*—Cohen, Pontani, Lieberman & Pavane

[57] ABSTRACT

A rotary coupled transmission line cell is disclosed which generates standard electromagnetic waves needed for measuring the electromagnetic wave susceptibility (EMS), for measuring the electromagnetic wave interference (EMI) and for correcting the probe. In the present invention, two internal conductors are used to have a 4-port structure, and therefore, the generation of the circulation transmission waves are inhibited during the generation of the standard waves having arbitrary impedances. Therefore, accurate standard waves can be generated, and adjustments of arbitrary polarizations and arbitrary irradiating directions are made possible. Further, when an odd mode power supply is carried out to the internal conductors, the standard electromagnetic waves having a uniformity as high as 3 times that of the conventional ones can be generated. Further, an inverted L shaped test object supporting plate is installed, so that the polarization can be carried out with a greater adjustment width.

6 Claims, 6 Drawing Sheets

ROTARY COUPLED TRANSMISSION LINE CELL

BACKGROUND OF THE INVENTION

1. Field of the Invention

The present invention relates to a rotary coupled transmission line cell which generates standard electromagnetic waves (plane waves, magnetic waves and electric waves) needed for measuring the electromagnetic wave susceptibility (EMS), for measuring the electromagnetic wave interference (EMI) and for calibrating the probe.

2. Description of the Prior Art

The existing TEM (transverse electromagnetic) cell includes: Crawford TEM cell, GTEM (Giga-Htz TEM) cell, TTEM (triple TEM) cell, WTEM (wire TEM) cell, improved GTEM cell, automatic measuring TEM cell and the like. They can be classified into two types. That is, one of them is the one terminal TEM cell in which the input/output terminals are located on one face, and this category includes GTEM cell, WTEM cell, TTEM cell, and improved GTEM cell. The other is two-terminal TEM cell in which the input/output terminals are located on both faces, and this category includes Crawford TEM cell, asymmetric TEM cell, automatic measuring TEM cell, and 6-ports TEM cell.

All of them are adapted to measure electromagnetic wave interference, to measure electromagnetic susceptibility, and to calibrate antenna. The TEM cells belonging to the former class are capable of testing only far fields, while those belonging to the latter are capable of testing not only far fields but also near fields. Particularly, during the measurement of the electromagnetic interference, the former class is capable of measuring the dipole moments of the crossing components, while the latter class is not capable. Thus they are different. Particularly among the tow-terminal TEM cells, those which can adjust the polarization include: assembling type cylindrical TEM cell, automatic measuring TEM cell, 6-ports TEM cell, 8-ports variable impedance EM generating apparatus, and rotary cylindrical TEM cell.

Among them, except assembling type cylindrical TEM cell and rotary cylindrical TEM cell, all of them are capable of generating the standard electromagnetic waves at particular polarizations (45 degrees, 90 degrees, and 135 degrees), but are impossible to generate the standard electromagnetic waves having arbitrary polarizations. The technique of forming arbitrary polarizations is very important for measuring the electromagnetic susceptibility and the electromagnetic interference.

Rotary cylindrical TEM cell is that which has improved the narrow polarization range of the assembling type cylindrical TEM cell, the problem of the small uniform area for the test object, and the accuracy of the angle adjustment.

However, there is disposed one internal conductor in this TEM cell, and therefore, has to have a two-port structure. Therefore, as shown in FIG. 5a, the improvement of the internal electric field uniformity is limited. Further, in the case where the standard electromagnetic waves having arbitrary impedances are to be generated, there are produced circulating transmission waves, with the result that the accuracy is degraded.

SUMMARY OF THE INVENTION

The present invention is intended to overcome the above described disadvantages of the conventional techniques.

Therefore it is an object of the present invention to provide a rotary coupled transmission cell in which two internal conductors are installed above and below so as to improve the uniformity of the standard electromagnetic waves in the uniform area, and the generation of circulating waves due to the two-port system is eliminated during the formation of a standard remote field having arbitrary impedances so as to improve the accuracy.

In achieving the above object, the rotary coupled transmission cell according to the present invention includes: an external conductor tube for shielding external electromagnetic waves; a test object table for mounting a test object within the external conductor tube; a pair of internal conductors for generating electromagnetic waves onto the test object table; and a coaxial connector joining area as a power supply part installed on both sides of the external conductor tube, for supplying power to the internal conductor, so as to generate standard electromagnetic waves for measuring various electromagnetic waves, characterized in that the pair of the internal conductors mutually face each other and are rotatably installed; and a driving shaft for rotating the pair of the internal conductors is installed in a hand adjustable form.

The test object table is attached with an inverted L shaped rotary plate to maximally expand a rotating angle of the internal conductors.

The power supply part includes a first bearing and a second bearing installed in series in a stepped form, or includes a ring, so as to prevent leakages of electromagnetic waves, the leakages being inevitable in view of a structure of the rotating internal conductors. The internal conductors are designed to have a width for an exact impedance match based on an odd mode power supply method.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENT

Figure 1:
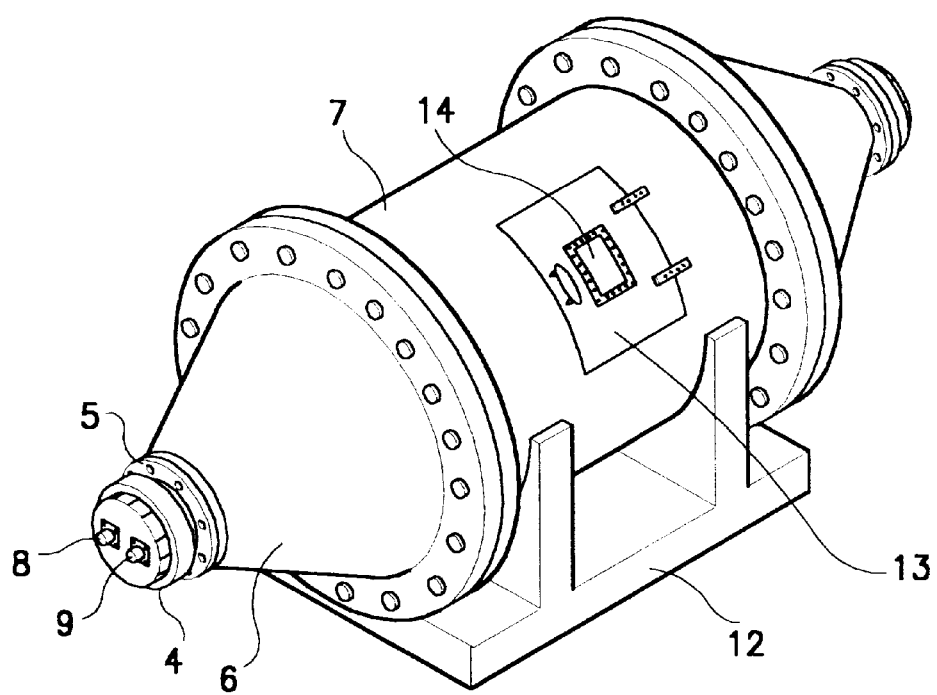
FIG. 1 is a perspective view schematically showing the rotary coupled transmission cell according to the present invention.

The rotary coupled transmission cell according to the present invention can be reviewed by dividing it into 3 parts. The first part is a test area 1 in which a test object is placed. The second part is the coaxial connector joining part 3 in which the coaxial cable connector is connected to a main body. The third part is a tapered part 2 which connects the test area 1 to the coaxial connector joining part 3.

As shown in FIGS. 1 to 4, the test area 1 includes: a first internal conductor 16 and a second internal conductor 17; a fourth external conductor 7; a door 13; a shielding window 14 for observing the state of the test object; a test object supporting part 15 for fixing the test object; and a support 12 for supporting the whole body.

Figure 4:
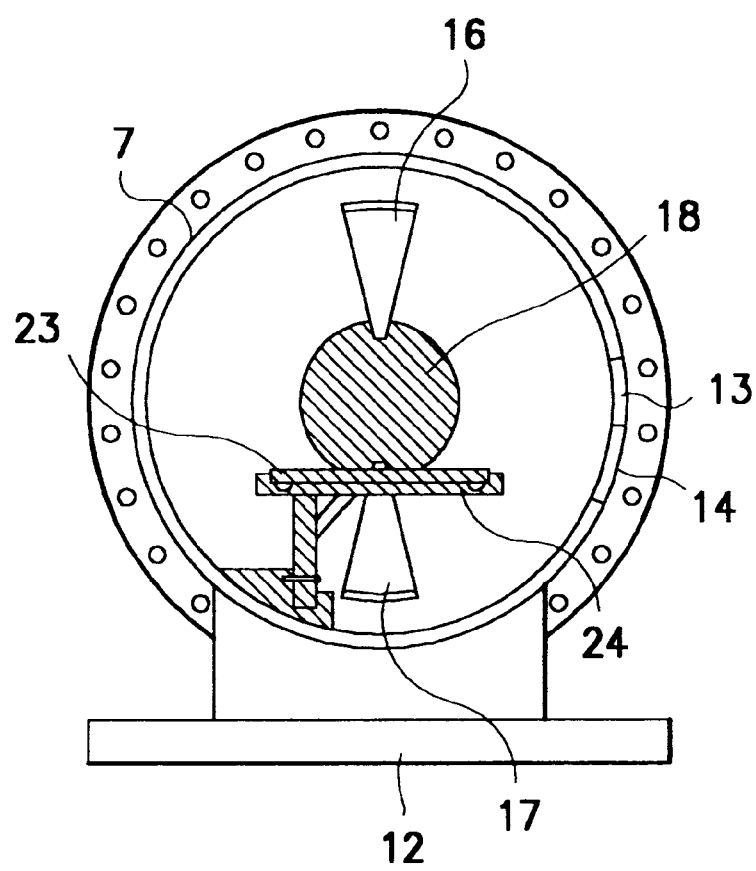
FIG. 4 is a side sectional view of the rotary coupled transmission cell according to the present invention.

As shown in FIG. 4, the first and second internal conductors 16 and 17 are installed above and below to form a uniform area (IEC1000-4-3: a ⅓ central area between the internal conductors and the external conductor). In this area, there is an anti-proportional relationship between the size and the available frequency. That is, if the size is large, the shielded frequency is lowered, with the result that the available frequency is so much lowered. Above the cut off frequency, the electromagnetic waves (plane waves) of the TEM mode are distorted, and therefore, the various related international standards (IEC, CISPR, EN and the like) recommend not to use it. Therefore, in the case where the size of the external conductor is fixed, the maximum securing of the uniform area having a certain uniformity is very important. Further, all the structures have to be matched with particular impedances (mainly 50 Ohms), and therefore, when the positions of the first and second internal conductors are decided, the widths of the internal conductors have to be decided.

However, in such a multiple transmission structure, particular impedances are related to the input voltages of the respective ports. Therefore, if the impedance matching is to be realized regardless of the input voltages of the respective ports, then the coupling amount between the internal conductors has to be reduced. In this structure, the coupling amount can be reduced by remotely separating the internal conductors from each other.

The interpretation figures (these figures well corresponds with the experiments) for the width of the internal conductors (here it is assumed that the thickness of the internal conductors is very small) for providing an impedance of 50 Ohms in accordance with the positions of the internal conductors during an odd mode between the first and second terminals are shown in Table 1.

<Table 1>

Angle of the hypotenuse of the internal conductor at radii ($r_2$: distance from the central point) of the internal conductors 16 and 17 of the rotary coupled transmission cell for having a characteristic impedance of 50 Ohms; and electric field strength at the central point when voltages of 1V and −1V are supplied to the first and second internal conductors 16 and 17 in a structure in which the radius (r) of the external conductor is 1 m.

| Internal conductor radius ($r_2/r$) | Hypotenuse angle of internal conductor | Electric field at Central point (V/m) |
| --- | --- | --- |
| .700 | 91.939 | 1.499 |
| .710 | 89.037 | 1.453 |
| .719 | 86.099 | 1.407 |
| .729 | 83.130 | 1.361 |
| .738 | 80.134 | 1.315 |
| .748 | 77.177 | 1.268 |
| .757 | 74.082 | 1.220 |
| .767 | 71.034 | 1.173 |
| .776 | 67.977 | 1.124 |
| .786 | 64.914 | 1.076 |
| .795 | 61.849 | 1.028 |
| .805 | 58.785 | .979 |
| .814 | 55.723 | .930 |
| .824 | 52.666 | .881 |

-continued

| Internal conductor radius ($r_2/r$) | Hypotenuse angle of internal conductor | Electric field at Central point (V/m) |
| --- | --- | --- |
| .833 | 49.617 | .831 |
| .843 | 46.581 | .782 |
| .852 | 43.563 | .732 |
| .862 | 40.560 | .683 |
| .871 | 37.563 | .633 |
| .881 | 34.563 | .584 |
| .890 | 31.575 | .534 |
| .900 | 28.645 | .485 |
| .909 | 25.811 | .436 |
| .919 | 23.033 | .388 |
| .928 | 20.165 | .340 |
| .938 | 17.029 | .290 |
| .947 | 13.723 | .238 |
| .857 | 10.841 | .185 |
| .966 | 8.821 | .135 |
| .977 | 7.556 | .091 |

The above data were obtained with the radius of the external conductor fixed to 1 m.

Figure 5A:
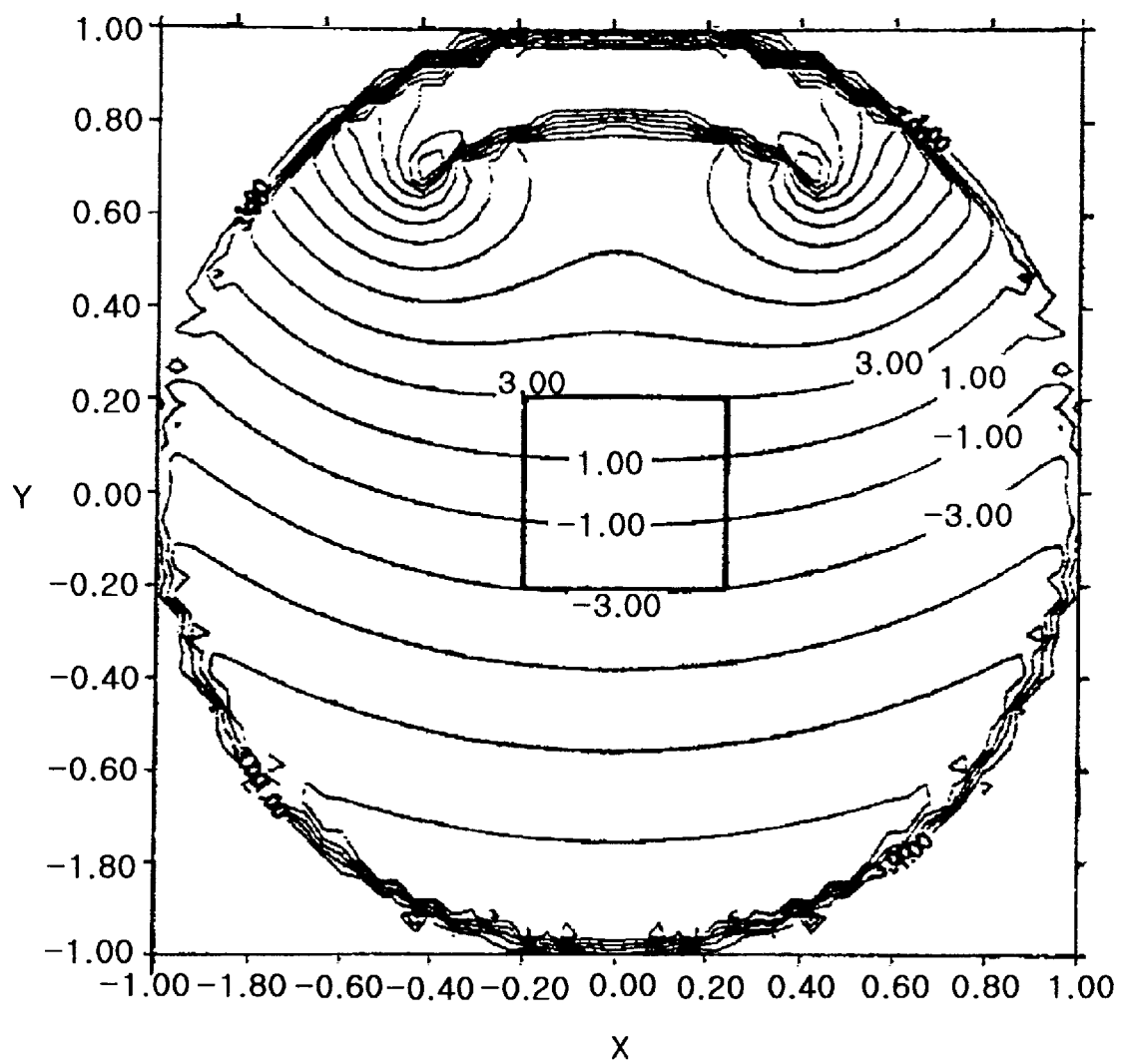
FIG. 5a illustrates the normalized electric field value relative to the electric field of the central point within the conventional rotary cylindrical TEM cell.
Figure 5B:
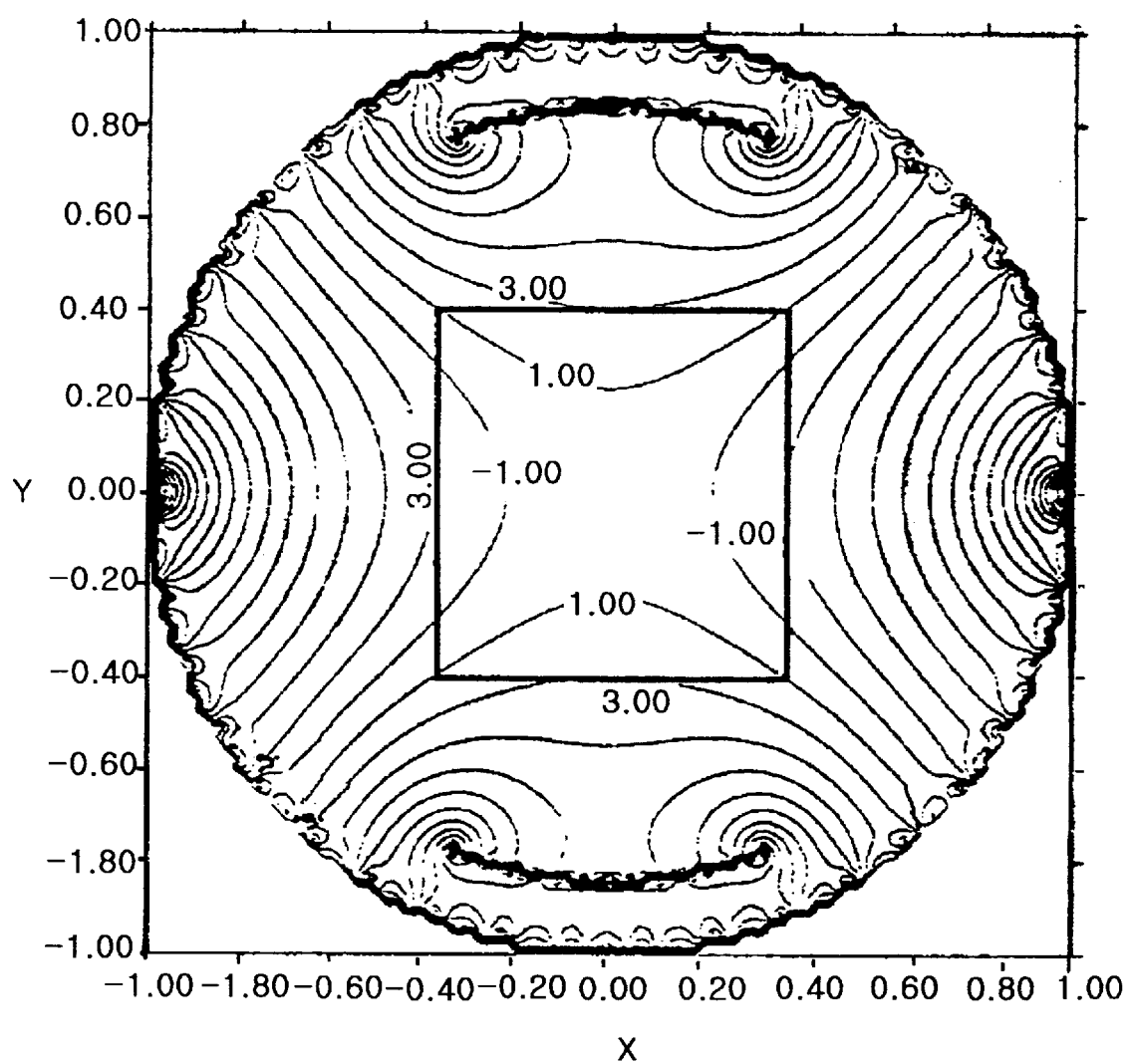
FIG. 5b illustrates the normalized electric field value relative to the electric field of the central point within the rotary coupled transmission cell according to the present invention.

FIGS. 5a and 5b compare the characteristics of electric field value of the present invention with the conventional one, for the case where the radius of the external conductor is 1 m, the distance from the central point to the minimum distance line of the two internal conductors is 0.8 m, and the characteristic impedance is 50 Ohms.

That is, FIG. 5a illustrates the normalized electric field value relative to the electric field of the central point within the conventional rotary cylindrical TEM cell. FIG. 5b illustrates the normalized electric field value relative to the electric field of the central point within the rotary coupled transmission cell according to the present invention.

Further, the uniformity of the electromagnetic waves of the uniform area has very different values depending on where the internal conductors are positioned. That is, as the two internal conductors are positioned more remotely, the width of the internal conductors is reduced, and consequently, the field uniformity is lowered as shown in Table 1.

FIG. 5a illustrates the electric field distribution which is normalized relative to the electric field value of the central point in a conventional rotary cylindrical TEM cell having a characteristic impedance of 50 Ohms, with the minimum distance between the internal conductors being 0.8 m. FIG. 5b illustrates the electric field distribution of the rotary coupled transmission cell of the present invention having the same size. The +/−3 dB region in the conventional TEM cell shows to be 0.21 m*0.21 m, whereas the rotary coupled transmission cell of the present invention shows 0.8 m*0.8 *m. Thus the uniformity is higher in the present invention. That is, the uniformity is improved by about 3 times, so that high quality electromagnetic waves can be generated.

To look into the test object supporting part 15 which is installed in the test region 1, a rotary circular plate 23 for mounting a test object is separated from a circular plate supporting plate 24, so that it would be rotatable. Between them, there is installed a third bearing 25 to make the rotations smooth. In order to reduce the scattering of the electromagnetic waves, the third bearing is made of a non-conductive hard material such as ceramic. As shown in FIG. 4, the supporting plate 24 is installed in an inverted L shaped form, so that a maximum angle would be ensured during the rotations of the internal conductors. Thus there is solved the problem that the generation of the standard electromagnetic waves during the vertical polarization is impossible with the general rotary plate installed.

In order to minimize the scattering influence, the test object supporting part 15 is made of a non-conductive material such as teflon or one of other plastic materials. The rotary circular plate 23 and the circular plate supporting plate 24 are provided with scales, so that the position and the rotating angle of the test object can be seen.

The coaxial connector joining region 3 not only connects the coaxial cable to the cell body, but also ensures that the first and second internal conductors 16 and 17 should be rotated separately from the external conductor 7. That is, like the test object supporting part is capable of adjusting the irradiating direction of the electromagnetic waves, so it is capable of shifting the positions of the internal conductors to adjust the polarization of the electromagnetic waves.

As shown in FIG. 4, when the first and second internal conductors 16 and 17 are rotated around the axis of a fourth external conductor 7, a fixed state is maintained without alteration of the overall structure, and therefore, the characteristic impedance is maintained constant. The present invention is based on this principle.

Figure 2:
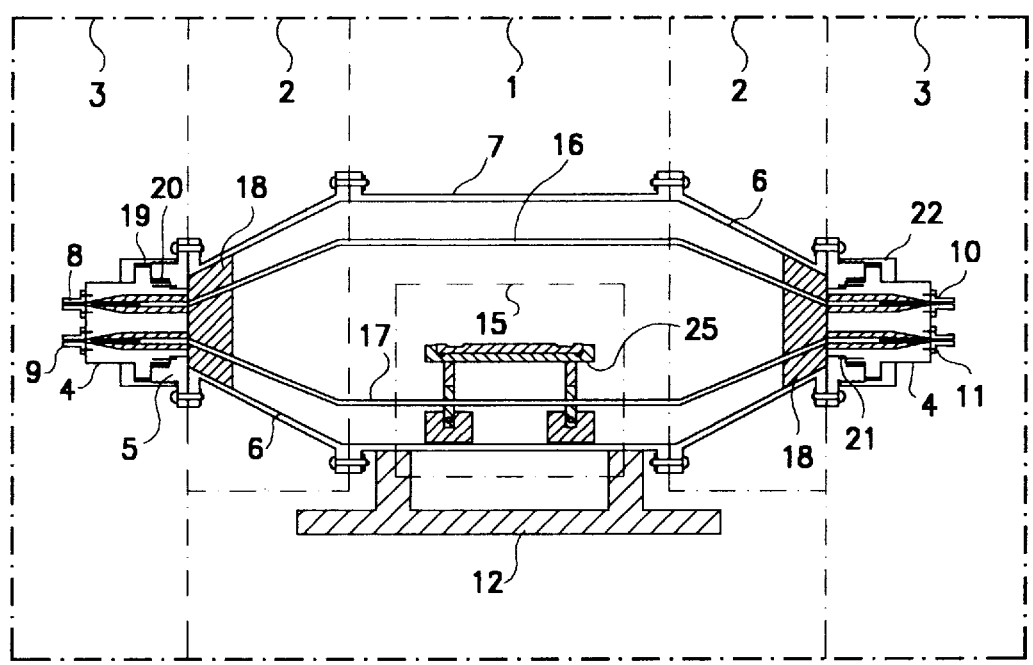
FIG. 2 is a plan view of the rotary coupled transmission cell according to the present invention.
Figure 3:
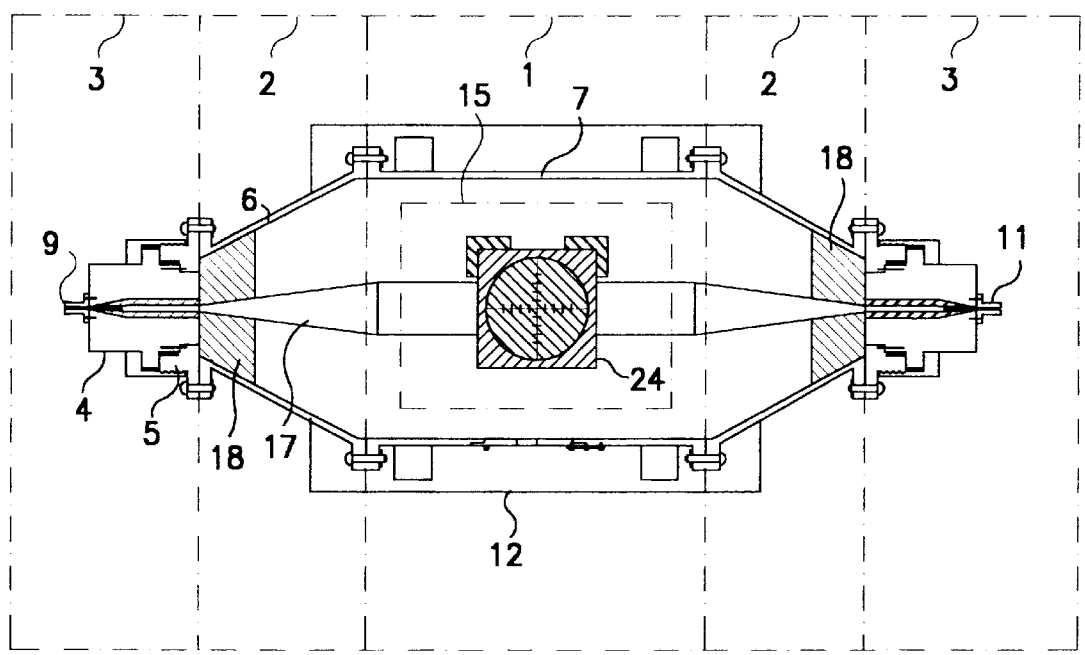
FIG. 3 is a frontal sectional view of the rotary coupled transmission cell according to the present invention.

The structure for rotating the internal conductors is as follows. That is, a first external conductor 4 rotates separately from a second external conductor 5. The first external conductor 4 is connected to an internal dielectric medium 18 which supports the first and second internal conductors 16 and 17. Further, the first external conductor 4 is also connected to the first and second internal conductors 16 and 17. Further, at the other end of the cell, the structure is same, and therefore, the first and second internal conductors rotate with the same angular positions. Further, in order to make the rotation between the first external conductor 4 and a second external conductor 5 smooth, a first bearing 19 and a second bearing 20 are installed. These bearings are installed in a stepped form as shown in FIG. 2, and therefore, not only the rotations become smooth, but also the contact area between the first external conductor 4 and the second external conductor 5 is expanded. Thus the capacitance is increased, and therefore, a high shielding effect is realized. Further, a ring 21 is installed between them to further improve the shielding effect. Further, in order to facilitate the manufacture, the second external conductor 5 is connected to a third external conductor 6 as a separate component.

The tapered region 2 includes the third external conductor 6, the first internal conductor 16, the second internal conductor 17 and the internal dielectric medium 18. The tapered form is provided to expand the test object placing region, and this tapered region should be as short as possible within a range of preventing the distortions of the electromagnetic waves. If the tapered region is long, the effective length is extended, with the result that the resonance frequency is lowered.

In the above structure, the dielectric medium 18 has to be fixed by using an adhesive so that it would be strongly attached to the first external conductor 4. Meanwhile, a small clearance is provided between the second external conductor 5 and the third external conductor 6, so that they would rotate separately.

According to the present invention as described above, a test region having a high uniformity is ensured, and a precise proximal standard near field having arbitrary impedances (which was difficult to obtain in the conventional apparatus) can be generated. Further, the uniformity of the force field gives an effect improved by 3 times or more, with the result that more precise corrections, more accurate wave interference measurements and more precise electromagnetic susceptibility measurements are rendered possible. Further, an inverted L shaped test object supporting plate is installed, and therefore, not only the horizontal and vertical polarizations but also the expansion of the rotating angle are improved.

What is claimed is:

1. A rotary coupled transmission cell comprising:

an external conductor tube having a circular cross-section for shielding external electromagnetic waves;

a test object table for mounting a test object within said external conductor tube;

a pair of internal conductors disposed in a mutually confronting relationship and rotatably mounted for generating electromagnetic waves toward said test object table; and a coaxial connector joining area installed on at least one end of said external conductor tube for supplying power to said pair of internal conductors so as to generate standard electromagnetic waves for measuring various electromagnetic waves.

2. The rotary coupled transmission cell of claim 1, wherein said test object table is attached to an inverted L shaped rotary plate to maximally expand a rotating angle of said internal conductors.

3. The rotary coupled transmission cell of claim 1, further comprising a first bearing and a second bearing installed in series in a stepped form in said coaxial connector joining area for rotating said pair of internal conductors so as to prevent leakages of electromagnetic waves.

4. The rotary coupled transmission cell of claim 1, wherein said pair of internal conductors are designed to have a width for an exact impedance match based on an odd mode power method.

5. The rotary coupled transmission cell of claim 1, further comprising a ring in said coaxial connector joining area for rotating said internal conductors so as to prevent leakages of electromagnetic waves.

6. The rotary coupled transmission cell of claim 1, wherein the coaxial connector joining area is installed on a first and a second end of said external conductor tube.

* * * * *